(12) United States Patent
Liu et al.

(10) Patent No.: US 11,443,760 B2
(45) Date of Patent: Sep. 13, 2022

(54) ACTIVE SOUND CONTROL

(71) Applicant: DTEN, Inc., San Jose, CA (US)

(72) Inventors: Wei Liu, San Jose, CA (US); Jin Guo, San Jose, CA (US); Sally Tung, San Jose, CA (US); Yuchen Zhou, San Jose, CA (US); Jinxin Dong, San Jose, CA (US)

(73) Assignee: DTEN, Inc., San Jose, CA (US)

( * ) Notice: Subject to any disclaimer, the term of this patent is extended or adjusted under 35 U.S.C. 154(b) by 178 days.

(21) Appl. No.: 17/107,031

(22) Filed: Nov. 30, 2020

(65) Prior Publication Data

US 2021/0350822 A1 Nov. 11, 2021

Related U.S. Application Data

(60) Provisional application No. 63/022,130, filed on May 8, 2020.

(51) Int. Cl.
| | |
|---|---|
| *G10L 25/78* | (2013.01) |
| *H04R 3/04* | (2006.01) |
| *G10L 25/27* | (2013.01) |

(52) U.S. Cl.
CPC .............. *G10L 25/78* (2013.01); *G10L 25/27* (2013.01); *H04R 3/04* (2013.01); *H04R 2430/01* (2013.01)

(58) Field of Classification Search
CPC ... G10L 25/78; G10L 2025/783; G10L 25/27; G10L 17/00; G10L 17/26; G10L 21/02088; G10L 25/308; G10L 25/51; H04R 3/04; H04R 3/005; H04R 2430/01; H04R 2225/43; H03G 3/32
See application file for complete search history.

(56) References Cited

U.S. PATENT DOCUMENTS

| | | | |
|---|---|---|---|
| 10,121,494 B1* | 11/2018 | Sundaram | G10L 25/51 |
| 2008/0267416 A1* | 10/2008 | Goldstein | H04R 3/00 |
| | | | 381/56 |
| 2020/0296521 A1* | 9/2020 | Wexler | H04R 25/405 |

* cited by examiner

*Primary Examiner* — Yogeshkumar Patel
(74) *Attorney, Agent, or Firm* — Lempia Summerfield Katz LLC

(57) ABSTRACT

A system automatically controls an electronic device's audio by detecting an active sound source presence within an auditory detection space. The system transitions the electronic device to selectively output a desired sound when the active sound source presence is detected and detects sound in the auditory detection space. The system enhances sound and transforms it into electrical signals. The system converts the electrical signals into a digital signal and identifies active sound segments in the digital signals. The system attenuates noise components in the digital signals and locates the physical location of the active sound source. It adjusts an output automatically by muting a second sound source in a second detection space.

20 Claims, 5 Drawing Sheets

ACTIVE SOUND CONTROL

PRIORITY CLAIM

This application claims the benefit of priority from U.S. Provisional Application No. 63/022,130 filed May 8, 2020, titled "Active Sound Control", which is herein incorporated by reference.

BACKGROUND OF THE DISCLOSURE

Technical Field

This application relates to acoustics, and specifically to systems that enhance and differentiate sound.

Related Art

It is challenging to classify sound in acoustic environments. It is subject to human speakers, transient noises, and dogs barking. In many situations, desired sounds are corrupted by the communication mediums conveying them and the noises that interfere with them. When noise occurs near a receiver, it may completely mask desired sounds making the sounds unrecognizable.

Desired sounds like undesired sounds come from many sources and occur in many different environments. There are no simple approaches to automatic sound classifications that distinguish sound sources. For example, there are significant challenges to robustly classifying portions of the sound spectrum that identify speakers and animals while dampening noise.

DETAILED DESCRIPTION

An automated sound control system separates and identifies sound sources using aural profiles that include measurable characteristics. These characteristics identify, and in some systems, authenticate persons and/or differentiate persons from animals. They may represent dominant frequencies, detectible durations, and amplitudes of tones, words, or phrases. Each source has a different aural print even when generating a common sound. For example, when different users speak the same word, each user will have a different output that is rich in unique identifiers. The distinguishing features become more substantial as the number of words, sounds, and/or expressions are captured to the point that the source is uniquely identified. In some systems, the aural profiles comprise tables that quantify characteristics of a spectrum or the presence of dominant frequencies in a captured sound segment transformed into electrical signals. When identifications or authentications are needed, the systems identify segments, extract code identifiers from the segments, compare them to the aural profiles, and match them to the vocabulary of sounds to differentiate human utterances.

To improve detections and differentiations, some systems analyze signal segments to determine whether they include characteristics that have vocal or animal characteristics (e.g., identifying characteristics). If the signal lacks identifying characteristics, the system may substantially eliminate or dampen undesired portions of the signal referred to as noise (e.g., an unwanted signal occurring naturally or by sound processing that interferes with the communication). Noise may be dampened in the presence of identifying characteristics, and may be detected and dampened in real time (e.g., processing at the same rate or at a faster rate than the data is received preventing or substantially minimizing a detection), near real-time, or after a delay, such as a buffering delay (e.g., in milli-seconds). The system may also dampen or substantially remove continuous background and transient noises.

Figure 1:
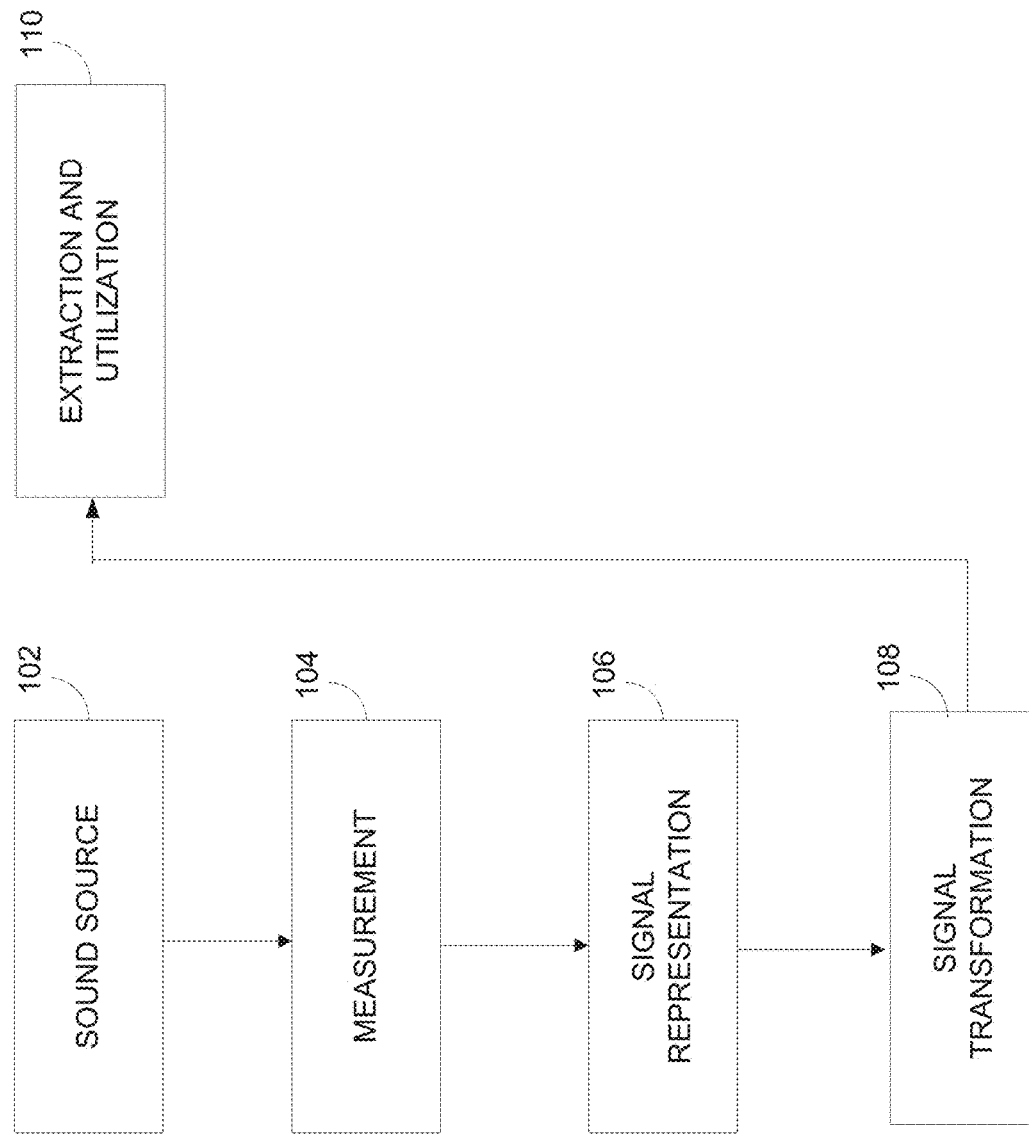
FIG. 1 is a process flow transforming signals and extracting information.

FIG. 1 is a partial flow diagram that generates representations of the signals. The process generates representations of the signals based on modeling at 102. The sound segments are captured by one or more devices that convert and transform the sound waves into electrical signals when active sounds sources are detected. Additional processing at 104 converts the output of the devices into digital data via sampling. Signal processing generates signal representations and executes signal transformations at 106 and 108. At 110, signal extraction and processing is executed, which automatically identifies sound sources (e.g., such as a speaker from a number of speakers). Some systems apply a pre-trained deep neural network (DNN) to identify active sound sources. An alternate system may average a portion of the spectrum across a sound segment, compare that average spectrum to average spectrum templates that are part of the aural profiles for each desired sound source to be identified, and based on the spectral similarity measurements, identifying the sound sources. Here, the result of the signal extraction is to identity of the sound sources, which occurs when the similarity exceeds a predetermined threshold and/ or when the DNN makes a prediction that has a confidence that exceeds a predetermined threshold.

The processing of the sound sources generates a representation of the signal in either a parametric or waveform structure. Because sound segments include both desired speech or desired sounds and noise components (e.g., a combinations of non-periodic and periodic noises) a noise detector may identify and sperate the noise and noise-like segments from the desired sound/speech segments in real-time, near real-time, or after a delay. When noise is detected, some noise detectors may model the temporal and/or spectral characteristics of the detected noise, and in other alternate systems, may also model the temporal space between noise occurrences or between the desired sound/speech segments and the noise occurrences. The one, two, or more process systems may generate models of the noise and/or spaces between them or store parametric attributes in a memory. Using a processor or signal processor, the model or parametric attributes are processed by a noise dampener or attenuator that substantially attenuates the noise from the sound segment. In some systems, a plurality of noise models may be used to model the various noises and/or spaces between them. Some models are combined, averaged, or manipulated to generate a desired response. Some models are derived from the attributes of one or more noise signals. Some models are adaptive meaning the models change with changing acoustical conditions, speech, and/or noise signals.

A measured correlation between the spectral and temporal shapes of a received spectrum and the modeled waveform or parametric form may identify a potential noise. When the potential noise is detected, the noise models may process and measure correlations at frequencies occurring before and after the potential detection to confirm the identifications, and in some systems, estimate or measure its durations. Once identified and confirmed, the noise is thereafter substantially dampened or attenuated by a noise attenuator and active sound sources identified as described herein.

In some systems, the detection and confirmation serves two tasks. First, it serves as a means for discovering the noise, discerning its nature, (e.g., periodic, transient, asynchronous, noncontinuous, noncontinuous) and attenuating it, which enhances the perceptual quality of the desired/transmitted signal. Second, the noise detection and confirmation aides in dynamically updating the noise model that functions in real time or batch time to improve the perceptual sound of the sound segment. This improvement makes the systems less generic as it adapts to specific applications and different acoustical environments.

Figure 2:
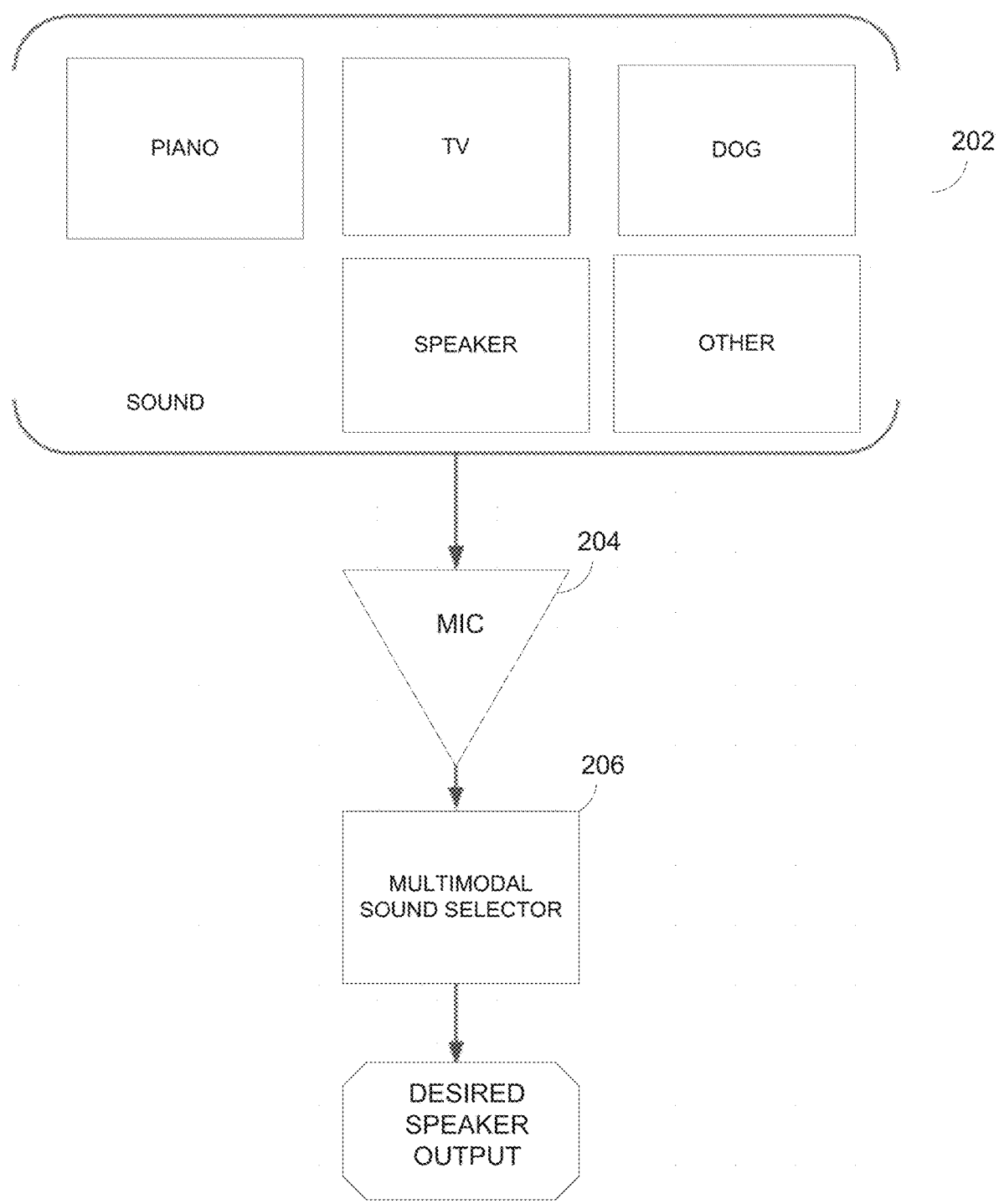
FIG. 2 is an exemplary environment of an automated sound control system.

FIG. 2 illustrates an automated sound control ecosystem that enhances the communication experience. The system includes a dynamic active mute feature that allows the system like a video conferencing system to deliver a desired output (effectively muting all other users including other non-selected active users and the surrounding noise) to enhance communication. The technology may be a unitary part of any device that is capable of capturing and/or processing aural sound. The system is dynamic and can be used in any background or front-end application. From a noise cancellation perspective, the system processes the microphone 204 captured sounds 202 within an auditory detection space and selects a desired output function. In some operating conditions, it identifies the physical location of and selects the active speaker (e.g., the selected user who speaks or provides sound), while active muting some or all of the other inputs while it attenuates noise. The systems trains on the users personal data to apply the active mute functions that may be applied in headphone, earphone, microphones, etc. By learning from the user's personal sound vocabulary, the systems recognize the user's voice that is stored in the user's aural profile.

When the automated sound control receives a mixed sound, it selectively outputs the user's sound and substantially mute all the other sounds including noises and other user's utterances by the multimodal sound selector 206 and/or microphone 204. The sound processing system may classify noise differences between human users and recognize animals and may enhance sound quality by generating and adding comfort noise to an output. Through a virtual ambient noise generator (also referred to as a comfort noise generator) that is part of or interfaces the multimodal sound selector 206, a receiver or transceiver on the other end of a communication provides a more natural and perceptual pleasing sound quality as judged from the end-point receiver.

In some systems, the user's physical presence is detected in the auditory detection space by a presence detector 302 and sound is captured, sampled, and stored via a cache and sampler 304. The systems detect noise and/or voice via a noise detector 306 and enhances a desired output by dampening undesired signals such as the level of background noise and other noises or non-selected utterances detected from the input sound segment. Those sounds are dampened by an attenuator 308. If the desired signal is speech, it comprises voiced speech such as vowels and unvoiced speech such as constants. Voiced speech has a regular harmonic structure; meaning it has harmonic peaks weighted by a spectral envelope. Unvoiced speech lacks a harmonic structure. Aural signals include non-periodic noises, periodic noises, and voiced and/or unvoiced speech.

Figure 3:
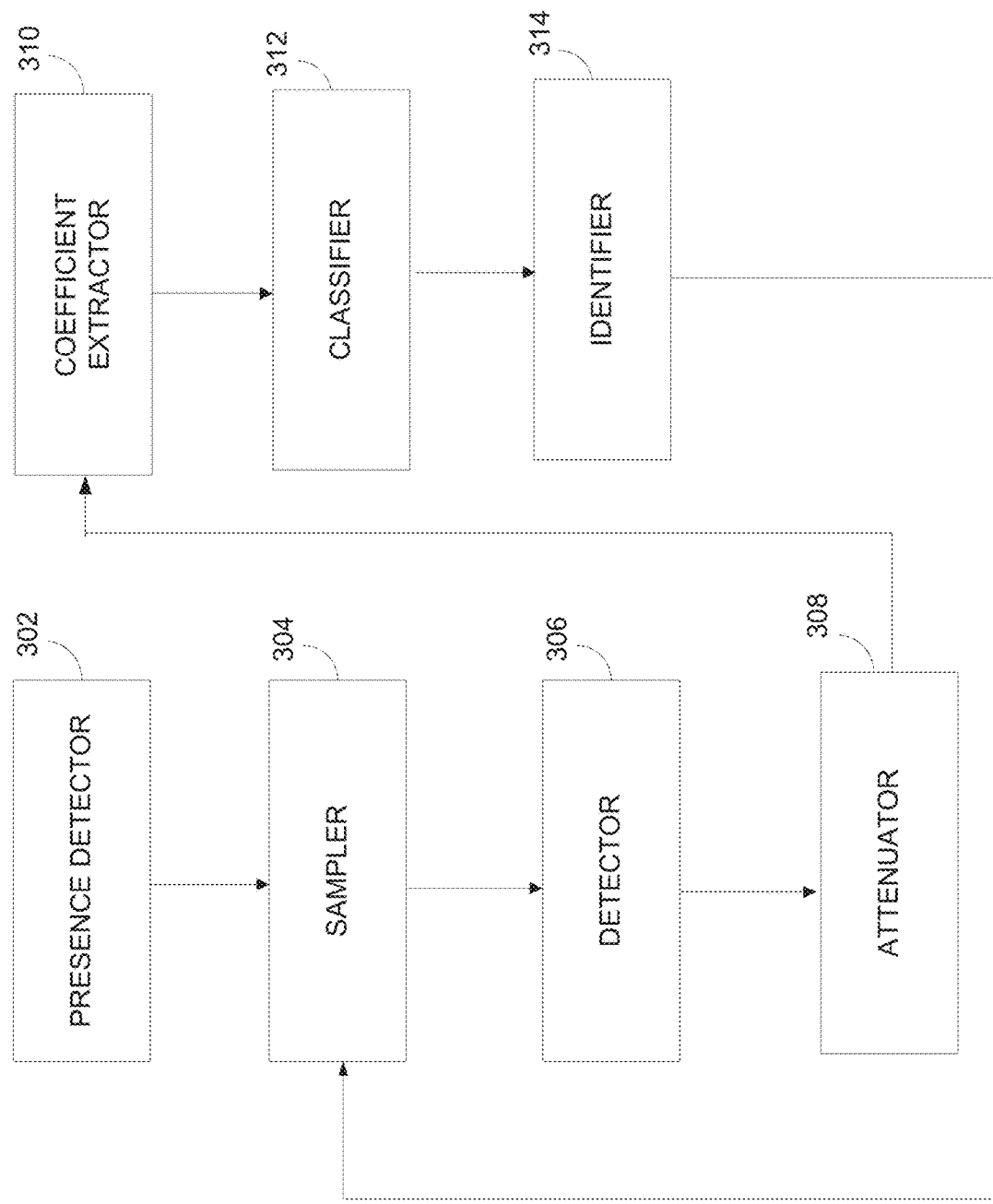
FIG. 3 is an automated sound control system and process.

In FIG. 3, a voice activity detector identifies speech. Speech may be identified by sampling the input at a predetermined sampling rate by a sampler 304 after a user's physical presence is detected by the presence detector 302. At periodic intervals such as at about fourth-tenths of a second, a coefficient extractor 310 transform the sampled inputs into Mel frequency cepstral coefficients that extracts features from the sampled input. Using a deep neural network, the system classifies the Mel coefficients as a desired sound such as speech or noise and identifies a human's physical presence through either a waveform and/or parametric analysis at 312. Thereafter, the sound source is identified at 314 and may be selected or actively muted depending on the application that uses it.

Figure 4:
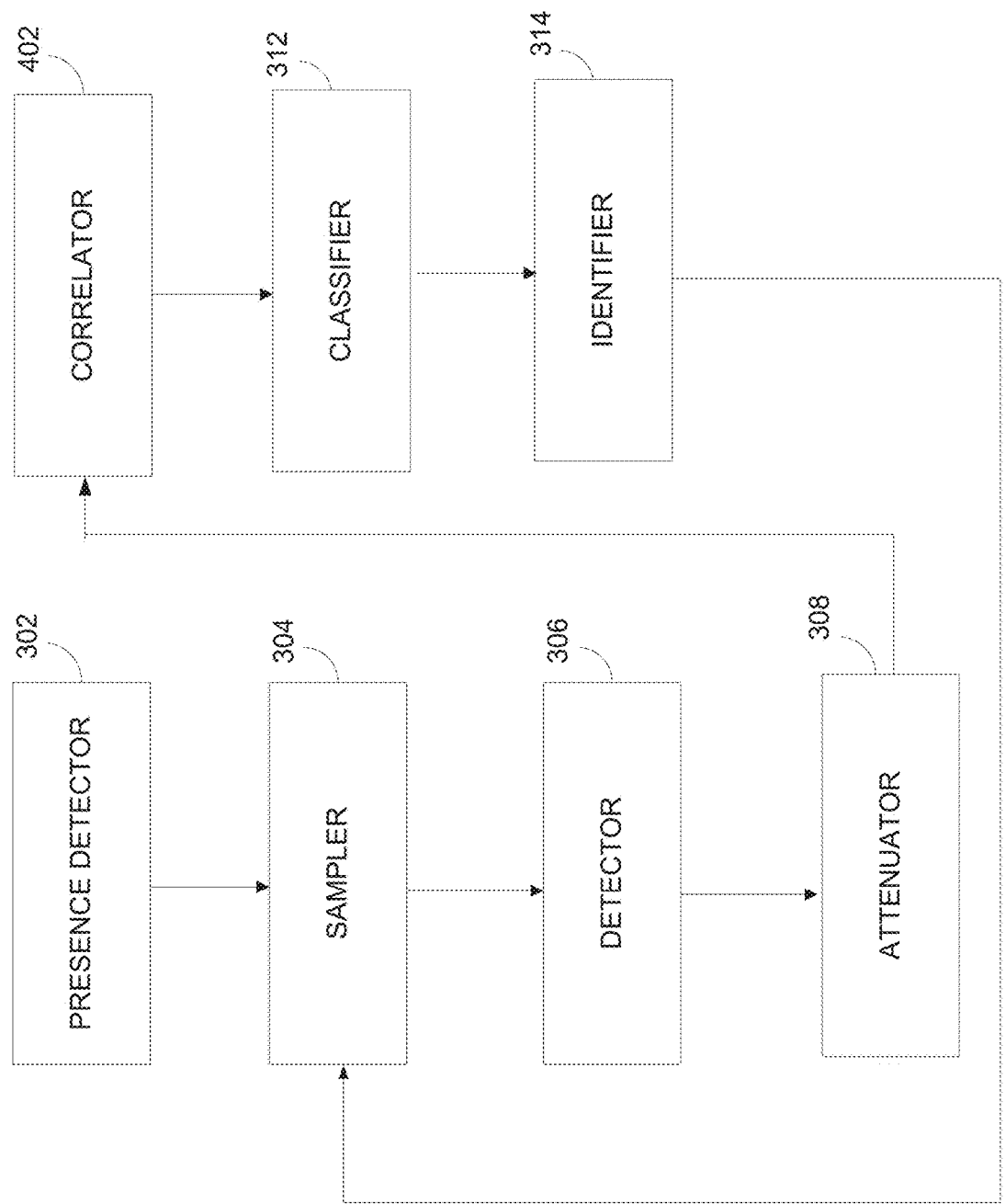
FIG. 4 is an alternate sound control system and process.

In an alternative systems, human voice differentiation and animal sound differentiation segments are identified when the sampled input signal is correlated with known noise events and/or is uncorrelated with speech by a correlator 402 as shown in FIG. 4. A correlation between the spectral and/or temporal shape of a sampled signal and a previously modeled shape or between previously stored attributes of noise and/or modeled signal attributes of desired signals may identify a potential noise segment and/or desired sound segment. When the correlation or uncorrelation levels exceed a predetermined threshold value, the signal segment is classified by the classifier 312 and marked as noise, an undesired signal, or speech spoken by a human user. When a desired sound is not identified, some alternate systems measure the noise such as the nearly continuous noise that is present near each of the microphones that may comprise the microphone array to estimate the background noise. The background noise measurement may be updated continuously when desired signals are not detected and at some intervals not measured when transient noise events are identified. Thereafter, background noise may be dampened in part to improve the perceptual quality of a delivered sound or processed by the ambient noise generator to establish a benchmark for the ambient noise that adds background noise in some applications to the processed signal to render a more perceptual pleasing and more consistent sound.

With sampled signals marked, a noise attenuator 308 dampens or attenuates the noise (including portions of the background noise) and noise like components from the sampled signal regardless of the amplitude of the incoming signal. When the identifier 314 marks noise or undesired signals, a modeler, such as an aural modeler (not shown) models the temporal and spectral components of the noise and undesired signals and generates a noise and/or undesired signal model, or alternatively, store attributes of those conditions in a data warehouse or a memory that is thereafter used to detect noise, identify a human presence, and in some systems improve the perceptual quality of speech that is transmitted to the various geographically separated participants via a tele/video-conferencing system. By updating the aural models continuously or periodically, the systems adapt to changing acoustical conditions naturally in a perceptually undetectable manner and do not require manual or scheduled calibrations or recalibrations.

With noise and undesired signals dampened, the system executes an acoustic localization through the microphone array 204 that comprises several microphones equidistant from each other. The time difference of arrival from between microphones is processed to determine the direction of arrival of the speech signals.

Using a steered response power with phase transform, the system estimates the time difference of arrival between microphones of the microphone array 204. The steered response power is a real-valued spatial vector, which is defined by the field of view (a.k.a., a view of the interactive space or auditory detection space referred collectively as the interactive space) of a specific array. A high maxima in the steered response power estimates the physical location of the active sound source in an audible area or auditory detection space. The steered response power is computed for each direction sensed by microphone pairs that comprise the microphone array 204 to generate a cumulative generalized cross-correlation with phase transform value across the pairs of microphones at the time delays associated with the established sensing directions. The phase transform effectively weighs the generalized cross correlation processed to determine the time difference of arrival.

By computing steered response power for points in the interactive space, a steered response power image is generated that renders images of the whole aural participant space and/or auditory detection space. The rendered images show signal energy distributions and the associated reverberation effects. To reduce the processing bandwidth processed to extract the global maximum estimation to locate the high maxima of the steered response power, the systems apply a stochastic region contraction that iteratively reduces the search volume for the high maxima. The process begins by searching the entire aural participant space or the whole field of view, and stochastically analyzes the function of the volume by selecting a predetermined number of points, and thereafter, contracting the analyzed physical volume into smaller volumes containing the desired high maxima, which continues recursively until the high maxima is located. The algorithm is thereafter repeated continuously or periodically to ensure speech source physical locations are precisely identified and updated in memory and ensures that the algorithm precisely reflects and tracks the changing speech sources, monitored conditions, and dynamics of the interactive space.

To enhance accuracy, some sound locators generate estimates of the high maxima in each of the regions monitored by the microphone pairs along with a measurement of their uncertainties. Once a high maxima is estimated, the estimate is weighted by applying a weighted average, with more weight given to estimates associated with higher certainties. Like steered response power with phase transform processes, this algorithm is recursive and runs in real-time processing the previously calculated state and an associated uncertainty matrix continuously and updating speech source physical localizations continuously.

In some systems, an optional agumentor supplements or confirms the physical location estimate of the active sound (e.g., the sound source's). The agumentor processes video streams rendered from single or multiple cameras that are processed by machine learning and tracking algorithms. The one or more machine learning algorithms that are part of the DNN, detect, classify, and track the active sound that interact with the system to confirm their physical locations. Classifiers within the optional augmentors identify the active sound source, and with respect to the other sound sources captured in the images, precisely discern their physical location(s). An exemplary machine learning algorithm trains active sound classifiers to detect image objects that reflect active sound sources, and in alternate systems, active speaking participants. The detections are triangulated in three or four dimensions to render multiple views of the image objects. Based on repeated training of the multiple views of the object shown in the video images captured by the camera(s), the machine learning algorithms train the classifiers that detect key points of the image object and mark the physical location of the captured objects as the active sound source. In some systems, the processing described in this disclosure occurs in real-time. The term real-time is intended to broadly encompass systems that process information at the same rate they receive data or a faster rate, enabling them to direct or control a process just like an automatic pilot and the speech locators described herein.

Rather than relying on a single machine learning algorithm to detect and classify active sound sources (or alternately, active speaking participants), some optional augmentors also process the video images using a second (different) type of machine learning algorithm (different from the first) in parallel to improve the accuracy and speed of the system's active sound recognitions and differentiations. In these augmentors, another optional classifier predicts bounding boxes enclosing a desired participants sound source using dimensions and clusters as anchor boxes to predict active sound source locations. The systems predict four coordinates for each bounding box (e.g., each sound source is tracked). Applying a regression, a predicted object score is generated. When a bounding box's object score exceeds a predetermined threshold, a feature extraction is executed by a feature extractor processing the video images using successive 3×3 and 1×1 convolutional layers (e.g., fifty-three convolutional layers in an exemplary machine learning algorithm) until a predetermined mean-squared error is achieved. Each of the second-type of sound source classifiers are trained using full video images captured by the cameras using a multi-scaling processes to render more trained classifiers that render recognition predictions and confidence scores. Once trained, the classifiers process the captured video by processing video images in real-time.

In operation, the extracted features of the active sound source captured in the video image are processed by the various types of classifiers and the identifications with the highest confidence score are selected by the processor and designated as the active sound source. Thereafter, the optional augmentor discerns their precise physical location based on their positions relative to other objects captured by the video image. In some augmentors, the locations of the other objects are previously known in the interactive space and stored in the data warehouse. In some augmentor, a boosting configuration is used in which classifiers are serially combined to reduce residual error. To improve system accuracy, machine learning detections are repeated at periodic time intervals during active sound localization time periods. In some systems, the systems continuously re-find or identify new active sound objects (e.g., execute a completely new locating/detecting process) and in other systems, in a predetermined time periods such as every five-to-ten seconds before confirming or identifying new locations of the one or more active speakers.

Based on the predictions of the locator and optional augmentor, the estimated location of the sound source is known. When the predictions vary, a composite estimate may be derived. In these alternate systems, the estimates are updated using a weighted average, with more weight given to the estimates that have a higher certainty and less weight given to the estimates having a lower certainty. Using the various estimates, a weighted average provides an estimate of the active speech source location.

With the active sound sources identified, sound selections and active muting occur and a perceptually enhanced sound is delivered to a desired location. Sound sources are selected and control signals are generated by a controller that drives audio selections and the active muting. The system automatically adjusts the audio mode selections by controlling the microphone and multimodal sound selections as different sound sources become active and move about a tele/videoconference area or come in and out of the audible area, which may be limited to a predetermined square-foot area. By noise dampening and dynamic muting the system ensures that all desired sound sources are captured.

Figure 5:
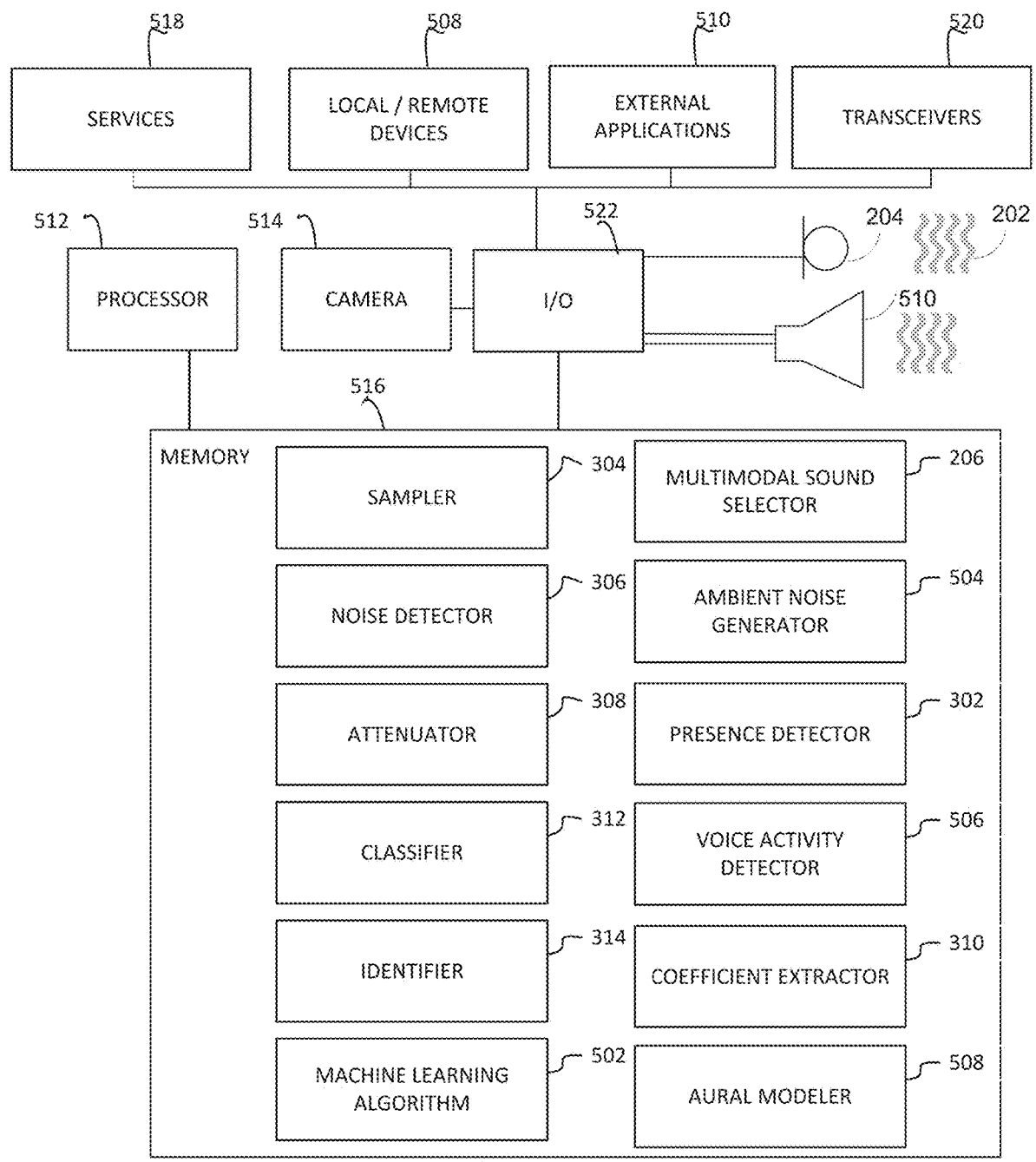
FIG. 5 is an alternate sound control system

Using audio locator technology and the optional video locator technology described herein, the system selects sound sources and automatically enhances the input, share perceptually improved sound with local and various geographically separated sources. The automatic and gradual adjustments occur asynchronously as different sound sources come into and out of the sound or audio/auditory detection space. The process is recursive and continuously monitors the sound detection space and adjusts sound delivery. FIG. 5 is a block diagram of systems that may execute the process flows, functions, and systems described above and those shown in FIGS. 1-4. The system comprises a processor or graphical processor 512, a non-transitory media such as a memory 516 (the contents of which are accessible by one or more processors and/or graphical processors 512), a network, local/and remote devices 508, external applications 510, external services 518, a microphone or microphone array 204, one or more loudspeakers 510, audio amplifiers (not shown), audio interfaces (not shown), one or more cameras 514, transceivers 520 and an I/O subsystem 522. The I/O sub system 522 connects devices and local and/or replicated remote software applications. The memory 516 stores instructions, which when executed by the processor 512, causes the system to render some or all of the functionality associated with automated sound control. The memory 516 stores instructions, which when executed by the processor 512, causes the system to automatically render functionality and hardware that enables automated sound through sample modules 304, noise detector modules 306, attenuator modules 308, classifiers 312, identifying modules 314, machine learning algorithm modules 502, multimodal sound selectors 206, ambient noise generators 504, presence detector modules 302, voice activity detector modules 506, coefficient extractor modules 310, and aural modelers 508. In yet another alternate system, the non-transitory media provided functionality is provided entirely or partially through cloud storage. The term cloud or cloud storage is intended to broadly encompass hardware and software that enables data to be maintained, managed, and backed up remotely and made available to users over a network. In this system, clouds and/or cloud storage provides ubiquitous access to the system's resources that can be rapidly provisioned over a private network. Clouds and/or clout storage allows for the sharing of resources to achieve coherence services.

The memory 516 and/or storage disclosed may retain an ordered listing of executable instructions for implementing the functions described above in a non-transitory computer code or executed by a computer implemented method. The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random-Access Memory (RAM), a Read-Only Memory (ROM), an Erasable Programmable Read-Only Memory (EPROM or Flash memory), or a database management system. The memory 516 may comprise a single device or multiple devices that may be disposed on one or more dedicated memory devices or disposed on a processor or other similar device. When functions, steps, etc. are said to be "responsive to" or occur "in response to" another function or step, etc., the functions or steps necessarily occur as a result of another function or step, etc. It is not sufficient that a function or act merely follow or occur subsequent to another. The term "substantially" or "about" encompasses a range that is largely, but not necessarily wholly, what is specified. It encompasses all but an insignificant amount, such as the values disclosed and/or a variance within a range of five to ten percent of the given value or range.

Alternate systems are not limited to the particular hardware and machine learning algorithms described above. Other suitable hardware and machine learning algorithms can be used. Furthermore, the systems are not limited to physically static systems. Rather, the systems can be used in head phones, earphones, microphones, and mobile devices and operate across distributed networks. The systems illustratively disclosed herein suitably may be practiced in the absence of any element (including hardware and/or software), which is not specifically disclosed herein. They may operate in the absence of those elements. Further, the various elements described in each of the many systems described herein is regarded as divisible with regard to the individual elements described, rather than inseparable as a whole. In other words, alternate systems encompass any variation and combinations of elements described herein and may be made or used without the various elements described (e.g., they may operate in the absence of one or more of the elements disclosed herein and/or shown in FIGS. 1-5).

An automated sound control system separates and identifies sound sources using aural profiles that include measurable characteristics that vary with time. These characteristics identify, and in some systems, identify and authenticate persons and/or differentiate animal sounds from human voice sounds. Each source or group of sources (e.g., animals) have a different aural print even when making a common sound. For example, when different users speak the same word, each user will have a different output that is rich in unique identifiers. In some systems, the aural profiles comprise tables that quantify characteristics of a spectrum or the presence of dominant sound sources in a captured sound segment. When identifications are or authentications are needed, the systems identify segments, extract code identifiers from the segments, compare them to the aural profiles, and match them to the vocabulary of sounds stored in the aural profiles to selectively and automatically output certain sounds and mute some or all other sounds.

The subject-matter of the disclosure may also relate, among others, to the following aspects (the aspects are referenced by numbers).

1. A computer implemented method of controlling an electronic device's audio output, comprising:
   detecting an active sound source presence within an auditory detection space;
   transitioning the electronic device to selectively transmitting a desired sound when the active sound source presence is detected;
   detecting a sound segment from the active sound source in the auditory detection space and enhancing the sound segment when transformed into electrical signals;
   converting the electrical signals into a digital signals;
   identifying active sound segments within the digital signals;

attenuating noise components within in the active sound segments;

identifying a physical location of the active sound source; and adjusting an output automatically by muting a second active sound source in the auditory detection space in response to the identifying of the physical location of the active sound source.

2. The computer implemented method of aspect 1 where the active sound presence is detected through a cross-correlation and a phase transform across a pair of microphones.

3. The computer implemented method of any of aspects of 1 to 2 where the auditory detection space comprises an interactive space and the sound source is generated by detecting energy distributions.

4. The computer implemented method of aspect 3 where the auditory detection space comprises an interactive space and the sound source is generated by a plurality of reverberation effects.

5. The computer implemented method of any of aspects of 1 to 4 where the detection of the active sound source comprises an analysis of a plurality of physical regions monitored by a plurality of microphone pairs.

6. The computer implemented method of aspect 5 where the analysis identifies a speech source and occurs continuously thereby tracking a plurality of changing speech sources.

7. The computer implemented method of aspect 6 where the changing speech sources identifies the speech source is further identified and the changing speech sources tracked through a triangulation in three dimensions and a processing of a plurality of video images.

8. The computer implemented method of aspect 7 where the processing of the plurality of video images is executed by a machine learning algorithm.

9. The computer implemented method of any of aspects of 1 to 8 further comprising modeling a plurality of temporal spaces of the noise components and the attenuating of the noise components is based on the modeling.

10. The computer implemented method of any of aspects of 1 to 9 where the noise components within in the active sound segments comprise noise components that occur near the active sound segments.

11. The computer implemented method of any of aspects of 1 to 10 further comprising averaging a portions of the active sound segment to render an average spectrum, comparing the average spectrum to average spectrum templates that comprise aural profiles, and identifying the sound source.

12. The computer implemented method of any of aspects of 1 to 11 where the device comprises a video teleconferencing system.

13. A method of controlling video teleconferencing device's audio output, comprising:

detecting an active sound source presence within an auditory detection space;

transitioning the video teleconferencing device to selectively transmitting a desired sound when the active sound source presence is detected;

detecting a sound segment from the active sound source in the auditory detection space and enhancing the sound segment when transformed into electrical signals;

converting the electrical signals into a digital signals;

identifying active sound segments within the digital signals;

attenuating noise components within in the active sound segments;

identifying a physical location of the active sound source; and adjusting an output automatically by muting a second active sound source in the auditory detection space in response to the identifying of the physical location of the active sound source.

14. The method of aspect 13 where the active sound presence is detected through a cross-correlation and a phase transform across a pair of microphones.

15. The method of any of aspects of 13 to 14 where the auditory detection space comprises an interactive space and the sound source is generated by detecting energy distributions.

16. The method of aspect 15 where the auditory detection space comprises an interactive space and the sound source is generated by a plurality of reverberation effects.

17. The method of any of aspects of 15 to 16 where the detection of the active sound source comprises an analysis of a plurality of physical regions monitored by a plurality of microphone pairs.

18. The method of aspect 17 where the analysis identifies a speech source and occurs continuously thereby tracking a plurality of changing speech sources.

19. The method of any of aspects 17 to 18 where the changing speech sources identifies the speech source is further identified and the changing speech sources tracked through a triangulation in three dimensions and a processing of a plurality of video images.

20. The method of any of aspects of 13 to 19 further comprising modeling a plurality of temporal spaces of the noise components and the attenuating of the noise components is based on the modeling.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A computer implemented method of controlling an electronic device's audio output, comprising:

detecting an active sound source presence within an auditory detection space;

transitioning the electronic device to selectively transmitting a desired sound when the active sound source presence is detected;

detecting a sound segment from the active sound source in the auditory detection space and enhancing the sound segment when transformed into electrical signals;

converting the electrical signals into a digital signals;

identifying active sound segments within the digital signals;

attenuating noise components within in the active sound segments;

identifying a physical location of the active sound source; and adjusting an output automatically by muting a second active sound source in the auditory detection space in response to the identifying of the physical location of the active sound source.

2. The computer implemented method of claim 1 where the active sound presence is detected through a cross-correlation and a phase transform across a pair of microphones.

3. The computer implemented method of claim 1 where the auditory detection space comprises an interactive space and the sound source is generated by detecting energy distributions.

4. The computer implemented method of claim 3 where the auditory detection space comprises an interactive space and the sound source is generated by a plurality of reverberation effects.

5. The computer implemented method of claim 3 where the detection of the active sound source comprises an analysis of a plurality of physical regions monitored by a plurality of microphone pairs.

6. The computer implemented method of claim 5 where the analysis identifies a speech source and occurs continuously thereby tracking a plurality of changing speech sources.

7. The computer implemented method of claim 6 where the changing speech sources identifies the speech source is further identified and the changing speech sources tracked through a triangulation in three dimensions and a processing of a plurality of video images.

8. The computer implemented method of claim 7 where the processing of the plurality of video images is executed by a machine learning algorithm.

9. The computer implemented method of claim 1 further comprising modeling a plurality of temporal spaces of the noise components and the attenuating of the noise components is based on the modeling.

10. The computer implemented method of claim 1 where the noise components within in the active sound segments comprise noise components that occur near the active sound segments.

11. The computer implemented method of claim 1 further comprising averaging a portions of the active sound segment to render an average spectrum, comparing the average spectrum to average spectrum templates that comprise aural profiles, and identifying the sound source.

12. The computer implemented method of claim 1 where the device comprises a video teleconferencing system.

13. A method of controlling video teleconferencing device's audio output, comprising:
   detecting an active sound source presence within an auditory detection space;
   transitioning the video teleconferencing device to selectively transmitting a desired sound when the active sound source presence is detected;
   detecting a sound segment from the active sound source in the auditory detection space and enhancing the sound segment when transformed into electrical signals;
   converting the electrical signals into a digital signals;
   identifying active sound segments within the digital signals;
   attenuating noise components within in the active sound segments;
   identifying a physical location of the active sound source; and
   adjusting an output automatically by muting a second active sound source in the auditory detection space in response to the identifying of the physical location of the active sound source.

14. The method of claim 13 where the active sound presence is detected through a cross-correlation and a phase transform across a pair of microphones.

15. The method of claim 13 where the auditory detection space comprises an interactive space and the sound source is generated by detecting energy distributions.

16. The method of claim 15 where the auditory detection space comprises an interactive space and the sound source is generated by a plurality of reverberation effects.

17. The method of claim 15 where the detection of the active sound source comprises an analysis of a plurality of physical regions monitored by a plurality of microphone pairs.

18. The method of claim 17 where the analysis identifies a speech source and occurs continuously thereby tracking a plurality of changing speech sources.

19. The method of claim 18 where the changing speech sources identifies the speech source is further identified and the changing speech sources tracked through a triangulation in three dimensions and a processing of a plurality of video images.

20. The method of claim 13 further comprising modeling a plurality of temporal spaces of the noise components and the attenuating of the noise components is based on the modeling.

* * * * *